(12) United States Patent
Rahajandraibe et al.

(10) Patent No.: US 9,134,191 B2
(45) Date of Patent: Sep. 15, 2015

(54) RESISTIVE DEVICE COMPRISING A SILICON-NANOWIRE-COMPRISING STRAIN GAUGE AND METHOD FOR OPTIMIZING THE ELECTRICAL CONSUMPTION OF SUCH A DEVICE

(75) Inventors: Wenceslas Rahajandraibe, Marseilles (FR); Stéphane Meillere, Besse sur Issole (FR); Edith Kussener, Le Revest les Eaux (FR); Hervé Barthelemy, Collobrieres (FR)

(73) Assignees: Centre National de la Recherche Scientifique, Paris (FR); Universite Du Sud-toulon Var, La Garde (FR); Universite D'Aix-Marseille, Marseilles (FR)

( * ) Notice: Subject to any disclaimer, the term of this patent is extended or adjusted under 35 U.S.C. 154(b) by 0 days.

(21) Appl. No.: 14/129,804

(22) PCT Filed: Jun. 29, 2012

(86) PCT No.: PCT/EP2012/062774
§ 371 (c)(1),
(2), (4) Date: Apr. 2, 2014

(87) PCT Pub. No.: WO2013/001081
PCT Pub. Date: Jan. 3, 2013

(65) Prior Publication Data
US 2014/0290376 A1    Oct. 2, 2014

(30) Foreign Application Priority Data
Jun. 30, 2011    (FR) ...................................... 11 55884

(51) Int. Cl.
*G01B 7/16*    (2006.01)
*G01L 1/22*    (2006.01)
(Continued)

(52) U.S. Cl.
CPC . *G01L 1/22* (2013.01); *B82Y 10/00* (2013.01); *G01P 15/122* (2013.01); *H01L 29/0669* (2013.01); *H01L 29/16* (2013.01); *H01L 29/8605* (2013.01); *B82Y 35/00* (2013.01)

(58) Field of Classification Search
CPC .................. G01L 1/22; H01L 29/0669; B81B 2201/0264
USPC ........................................... 73/760, 763, 777
See application file for complete search history.

(56) References Cited

U.S. PATENT DOCUMENTS 6,433,524 B1    8/2002 Yang et al.
8,156,807 B2    4/2012 Robert
(Continued)

FOREIGN PATENT DOCUMENTS

EP    2008965 A2    12/2008

OTHER PUBLICATIONS

Belloni, M., et al., *Low-Power Ripple-Free Chopper Amplifier with Correlated Double Sampling De-Chopping*, Department of Electronics, University of Pavia, Pavia, Italy, pp. 765-768, 2010.
(Continued)

*Primary Examiner* — Max Noori
(74) *Attorney, Agent, or Firm* — Novak Druce Connolly Bove + Quigg LLP

(57) ABSTRACT

A resistive device which includes at least one strain gauge (12, 14) comprising silicon nanowires, a power supply (16) that has at least one current source (22, 24) able to generate a current ($I_{bias}$) for biasing the strain gauge; and acquisition means (18) able to deliver a measurement signal which can be used to determine the variation in the electrical resistance of the gauge is provided. The power supply includes a chopper (26) allowing the biasing current generated by each current source to flow through each gauge only during a fraction of an operating cycle of the device.

12 Claims, 3 Drawing Sheets

(51) Int. Cl.
  *G01P 15/12* (2006.01)
  *H01L 29/06* (2006.01)
  *B82Y 10/00* (2011.01)
  *H01L 29/8605* (2006.01)
  *H01L 29/16* (2006.01)
  *B82Y 35/00* (2011.01)

(56) References Cited

U.S. PATENT DOCUMENTS

2004/0147969 A1* 7/2004 Mann et al. ............ 607/17
2006/0241701 A1* 10/2006 Markowitz et al. ............ 607/5
2007/0074584 A1* 4/2007 Talarico et al. ............ 73/856

OTHER PUBLICATIONS

Yoshida, T., et al., *A 1V Supply 50nV/√Hz Noise PSD CMOS Amplifier Using Noise Reduction Technique of Autozeroing and Chopper Stabilization*, 2005 Symposium on VLSI Circuits Digest of Technical Papers, pp. 118-121, Mar. 2010.

Mile, E., et al., *In-plane nanoelectromechanical resonators based on silicon nanowire piezoresistive detection* (2010), Nanotechnology 21, 165504, 2010 IPO Publishing Ltd., pp. 1-7.

* cited by examiner

RESISTIVE DEVICE COMPRISING A SILICON-NANOWIRE-COMPRISING STRAIN GAUGE AND METHOD FOR OPTIMIZING THE ELECTRICAL CONSUMPTION OF SUCH A DEVICE

CROSS-REFERENCE TO RELATED APPLICATIONS

This application claims benefit (under 35 USC 119(e)) of French Application Serial No. 12-03440, filed Dec. 17, 2012, which is incorporated herein by reference in its entirety.

TECHNICAL FIELD AND STATE OF THE ART

The invention relates to the field of resistive devices of the type comprising at least one strain gauge comprising silicon nanowires, a power supply comprising at least one current source able to generate a current for biasing the gauge; and acquisition means able to deliver a measurement signal which can be used to determine the variation in the electrical resistance of the gauge.

Such types of devices are currently known. They are for example used as the inertial sensor. The sensing element of such a device includes one or more silicon nanowires, each wire being used as a strain gauge. The detection of the strain is effected by measuring the variation of the resistance of the gauge when it is for example subjected to such an acceleration.

In order to do this, the gauge must be biased in the direction in which a biasing current is to flow through the silicon nanowire.

The measurement signal thus corresponds to the variation in voltage across the resistance that constitutes the biased gauge.

However, the sensitivity of the device is limited by the measurement signal to noise ratio (SNR for "Signal to Noise Ratio" in English).

Greater sensitivity, that is to say a greater SNR, requires a greater amplitude of the measurement signal which is obtained, all things being equal, by an increase in the current for biasing the gauge. However, the increase in the biasing current results in greater power consumption by the device.

Thus, generally speaking, the sensitivity of the device and the power consumption thereof are correlated.

Furthermore, in a more specific manner, in some applications considered for these devices, such as on-body inertial sensors meant for detecting human motion, the information relating to the motion is contained in the low frequency part of the measurement signal delivered by the device. In these applications, the bandwidth of interest goes, almost, from continuous, up to several hundred kilo Hertz.

However the background noise of such a device results from the superposition of the thermal noises of the gauge and the electronic acquisition means, but also from the intrinsic noise of the gauge. This intrinsic noise of the gauge is 1/f, that is to say proportional to the inverse of the frequency of the signal measured. The lower the frequency of the measurement signal, the greater is the noise.

In order to obtain an acceptable level of sensitivity at low frequencies, it is necessary for the amplitude of the measurement signal to be high. It is therefore necessary that the current for biasing the silicon nanowire be high. This results in the consumption of additional power by the device if it is desired to use it at low frequencies.

However, the power consumption of such a resistive device is a parameter that is to be minimised. Indeed, apart from these resistive devices, there exists another family of devices, namely capacitive devices. These latter are already widely used in particular because they do not require a biasing current in order to work. This makes them highly attractive in terms of the total power consumption of the system that includes them.

However, given that the variation of the capacitance with the mechanical stress remains low, these capacitive devices necessarily include high capacitances that are, by nature inherently cumbersome. This limits the possibilities of integrating systems using such capacitive devices.

Thus, for resistive devices based on silicon nanowire, which are compact devices, there is the problem of reducing their power consumption without however degrading their SNR. The resolution of this problem is crucial in order for the silicon nanowire based resistive devices to become more widely used in the industry.

The invention therefore aims to overcome this problem, in whole or in part.

SUMMARY OF THE INVENTION

For these purposes the object of the invention relates to a resistive device, a method of optimisation and a method of use thereof according to the claims.

Resistive device of the type comprising: at least one strain gauge (12, 14) comprising silicon nanowires; a power supply (16) comprising at least one current source (22, 24) able to generate a current ($I_{bias}$) for biasing the gauge; and acquisition means (18) able to deliver a measurement signal which can be used to determine the variation in the electrical resistance of the gauge, characterised in that the power supply comprises a chopper (26) allowing the biasing current generated by the or each current source to flow through the or each gauge only during a fraction of an operating cycle of the device.

DESCRIPTION OF THE DRAWINGS

The invention will be better understood upon reading the following description of a particular embodiment, provided purely by way of example and with reference made to the accompanying drawings in which.

DESCRIPTION OF EMBODIMENTS

The resistive device according to one aspect of the invention is an inertial sensor based on detection by silicon nanowires. It comprises, as the sensing element, a seismic mass suspended, in a resilient manner, by two silicon nanowires extending from both sides of the mass, along a direction X.

The silicon nanowires, when they are traversed by a suitable biasing current $I_{bias}$, constitute strain gauges whose variation in electrical resistance provides the ability to determine the acceleration along the direction X of the seismic mass.

Figure 1:
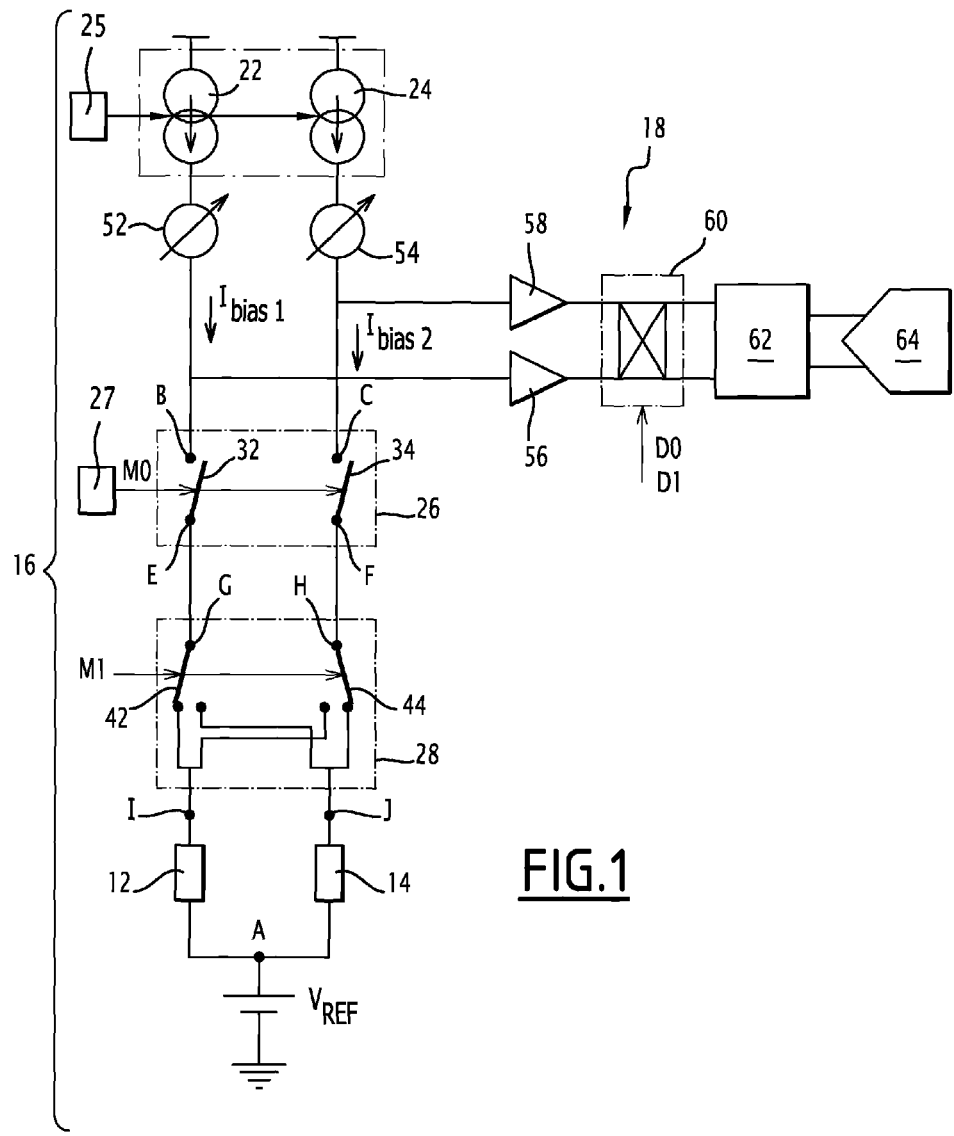
FIG. 1 is a schematic representation of the electrical circuit arrangement for a preferred embodiment of a silicon nanowire based resistive device.

FIG. 1 shows the electrical circuit arrangement of the resistive device according to the invention. This latter is referenced generally by the numeral 10.

The device 10 includes two gauges 12 and 14, one supply means 16 capable of generating a direct current DC for biasing the gauges 12 and 14, as well as the acquisition means 18 providing the ability to generate a measurement signal from which it is possible to trace the variation in resistance of each of the strain gauges and to determine the acceleration of the seismic mass (also called proof mass).

In a general manner, the electrical circuit shown in FIG. 1 is of the differential circuit type with common mode compensation. Other electrical circuit arrangements, known to the person skilled in the art may be envisaged. Examples that may be mentioned include electrical circuits referred to as "stand alone resistance", "push pull bridge", "Wheatstone bridge", etc.

The main advantage of a differential circuit with common mode compensation is to enable the reduction of the temperature drift of the gauges 12 and 14. This common mode compensation is preferable, although it is not deemed essential to the invention.

Thus, in the electrical circuit shown in FIG. 1, one of the terminals of each gauge 12, 14 is connected to a node A increased to a reference potential VREF.

The supply means 16 consist of two current sources, respectively 22 and 24, the means 25 for adjusting the intensity of the current $I_{BIAS1}$, $I_{BIAS2}$, delivered by each of the sources 22, 24, a stage of chopping 26 at the input terminals B and C from which are respectively connected the sources 22 and 24, the means 27 for adjusting the duty cycle of the chopping means 26 and a stage of stabilisation by switching 28 whose input terminals G and H are connected to the output terminals E and F of the chopping means 26, and whose output terminals I and J are respectively connected to the terminals of the gauges 12 and 14 which are not connected to the node A.

The chopping means 26 is equivalent to a pair of controlled switches 32 and 34 respectively. These two switches are controlled by the same chopping control signal M0 emitted by the means 27. When it is closed, the switch 32 permits the application of the current $I_{bias1}$ generated by the source 22 over the input terminal G of the stage 28.

In a similar manner, when it is closed the switch 34 permits the application of the current $I_{bias2}$ generated by the source 24 over the input terminal H of the stage 28.

The switching means 28 is the equivalent of a pair of two-state controlled flip flop toggles, respectively 42 and 44.

In the first state, the first flip flop toggle 42 provides the ability to connect the first input terminal G to the first output terminal I while the second flip flop toggle 44 provides the ability to simultaneously connect the second input terminal H to the second output terminal J of the means 28.

In the second state, the first flip flop toggle 42 provides the ability to connect the first input terminal G to the second output terminal J, while the second flip flop toggle 44 provides the ability to simultaneously connect the second input terminal H to the first output terminal I of the means 28.

The state of flip flop toggles 42 and 44 is controlled by the same switching control signal M1.

The acquisition means 18 delivers the measurement signal.

The means 18 include the means for measuring the biasing current comprising of two current sensors 52 and 54 respectively. Each sensor is disposed downstream of one of the current sources 22 and 24.

The means 18 also includes a means for measuring the voltage across the gauges. It includes amplifiers respectively of voltage tapped at the node B, voltage amplifier 56, and at the node C, voltage amplifier 58; downstream of the amplifiers, a means of demodulation 60 shown schematically; downstream of the demodulation means 60, a low pass filtre 62; and downstream of the filtre 62, a digitising means, such as an analogue to digital converter—ADC 64, capable of digitising the output signals generated by the low pass filtre.

The function of the demodulation means 60 is the demodulation of the amplified voltage signals resulting from the modulation of the application of the biasing currents to the gauges 12 and 14 by the switching means 28. The means 60 is controlled by two demodulation control signals D0 and D1 respectively.

Figure 2:
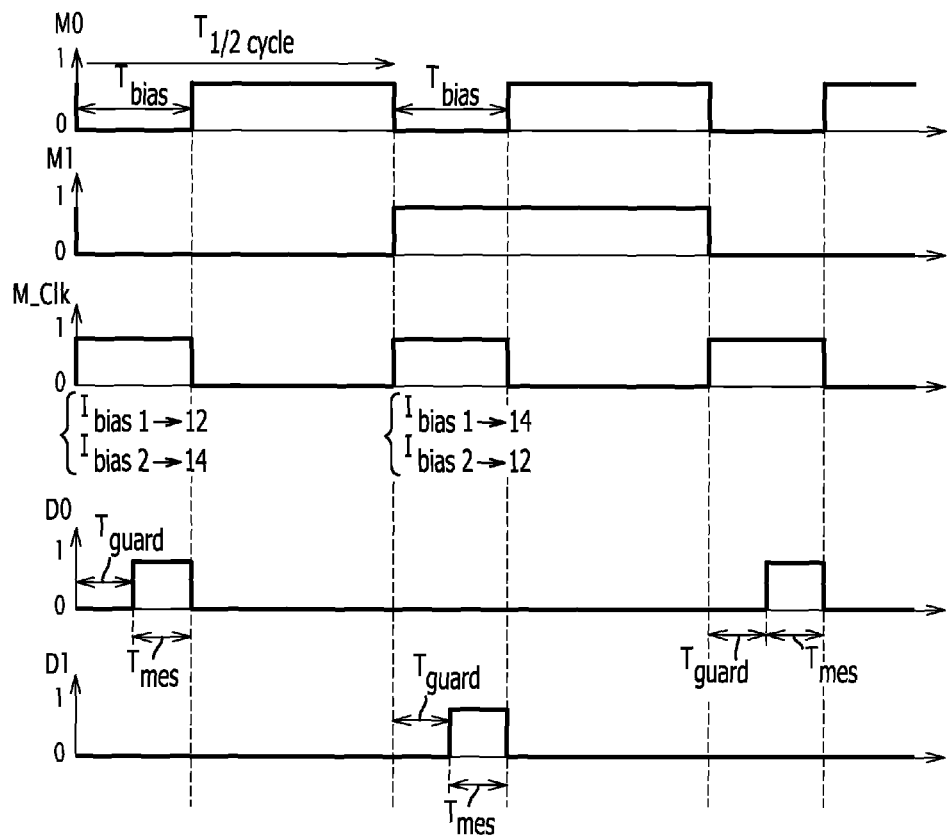
FIG. 2 is a timing chart showing the variation trend over time of different control signals of the electrical circuit in FIG. 1.

The control signals for the operation of the device shown in FIG. 1 are represented in FIG. 2.

The chopping control signal M0 is a burst signal between the values 0 and 1. It takes the value 0 over a first period $T_{bias}$ of a half cycle of operation, and the value 1 over the remainder of this half cycle.

The ratio of the time period $T_{bias}$ over the time period of one half cycle $T_{1/2\ cycle}$ corresponds to the duty cycle.

When the chopping control signal M0 has the value of 0, the switches 32 and 34 are closed so that the current $I_{bias1}$ generated by the source 22 is applied to the first input terminal G of the stage 28, while the current $I_{bias2}$ generated by the source 24 is applied to the second input terminal H of the stage 28.

When the control signal M0 takes the value 1, the switches 32 and 34 are open.

The switching control signal M1 is a burst signal between the values 0 and 1. It takes the value 0 over the first half cycle and the value 1 over the second half cycle following the operation of the device 10.

When the control signal M1 takes the value 0, the first and second flip flop toggles 42 and 44 are in the first state. The current $I_{bias1}$ then flows in the gauge 12 and the current $I_{bias2}$ in the gauge 14.

Conversely, when the control signal M1 takes the value 1, the first and second flip flop toggles are in the second state. The current $I_{bias1}$ flows in the gauge 12 and the current $I_{bias2}$ in the gauge 14.

The third timing chart diagram shown in FIG. 2 shows the combination of the states of the stages 26 and 28:
  during a first period Tbias of the first half cycle, the current I bias1 passes through the first gauge 12, while the current I2 passes through the second gauge 14;
  during the rest of the first half cycle no current flows through gauges;
  during a first period Tbias of the second half cycle, the current I bias1 flows in the second gauge 14, while the second current I bias2 flows through the first gauge 12; and,
  during the rest of this second half cycle no current flows in the gauges.

Also represented in FIG. 2, are the signals D0 and D1 of the stage of demodulation 60. These signals D0 and D1 are correlated to the signals M0 and M1. The signal D0 is essentially nil except during a time interval $T_{mes}$ included in the first period of the first half cycle.

In a similar manner, the signal D1 is essentially nil, except during a time interval $T_{mes}$ included in the first period of the second half cycle.

Thus, during the use of the device 10, the gauges 12 and 14 are biased by an electrical current for a fraction of the cycle of use of the device. To put it other words, the strain gauges are alternately biased by the currents $I_{bias1}$ and $I_{bias2}$ for the duration of the measurement, this measurement being performed only during a period of time $T_{bias}$ that is reduced with respect to the duty cycle (period of sampling) of the device. During the rest of the time, no current flows in the gauges which thus have zero power consumption.

This ability to use the gauges only over a fraction of the cycle time is due to the response time of silicon nanowires which is extremely low in comparison to the higher response time of the electronic acquisition means 18.

Thus, the chopping means provides the ability to reduce the power consumption of the device by only temporarily biasing the gauges.

However, in an unexpected manner it has been found, that the act of applying a biasing current in an alternating fashion through a gauge of the silicon nanowire type greatly reduces the intrinsic noise of this gauge. Experimental observations have been carried out in order to show that at low frequencies, there is no degradation of the signal to noise ratio when the duty cycle ratio is reduced from 75% to 25%. The act of reducing the duty cycle ratio leads to a decrease of the average power of the biasing current and, in consequence thereof, to a decrease in the average strength of the measurement signal. Nevertheless, the SNR however remains substantially constant. It is therefore concluded that the chopping reduces the strength of the intrinsic noise of the gauge.

In order to fully take advantage of this effect of mitigating the intrinsic 1/f noise of the gauge, the biasing current $I_{bias}$ is adjusted by way of the adjusting means 25 in the following manner.

Figure 3:
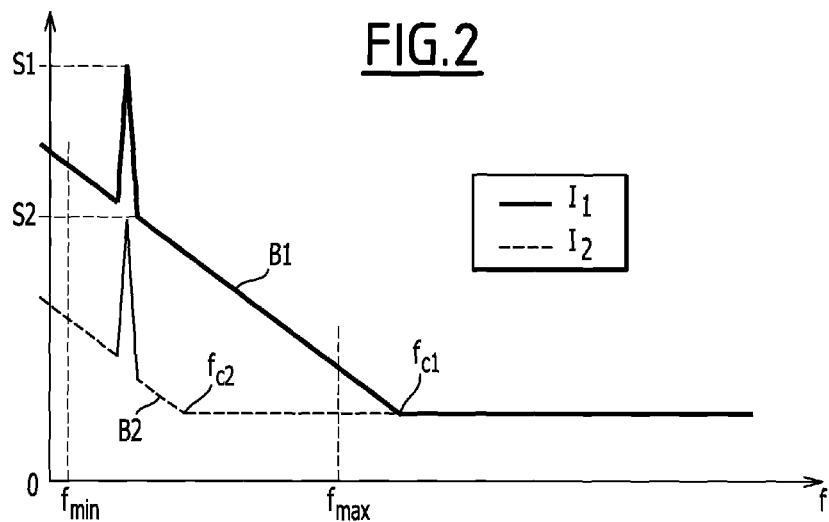
FIG. 3 is a graph showing the background noise affecting the device shown in FIG. 1 for two different values of the current for biasing the gauges.

FIG. 3 represents for two values of the biasing current $I_1$, $I_2$, the graph of the noise B1, respectively B2, affecting the measurement signal S1, respectively S2.

In the first part of the diagram, the part corresponding to the low frequencies, the noise is dominated by the intrinsic 1/f noise of the gauge. Beyond a characteristic frequency, referred to as corner frequency fc1, the noise is dominated by the thermal noise of the gauge and the electronic acquisition means, which is a noise that is substantially constant as a function of the frequency.

When the biasing current is reduced, the corner frequency moves towards the low frequencies (fc2<fc1).

Figure 4:
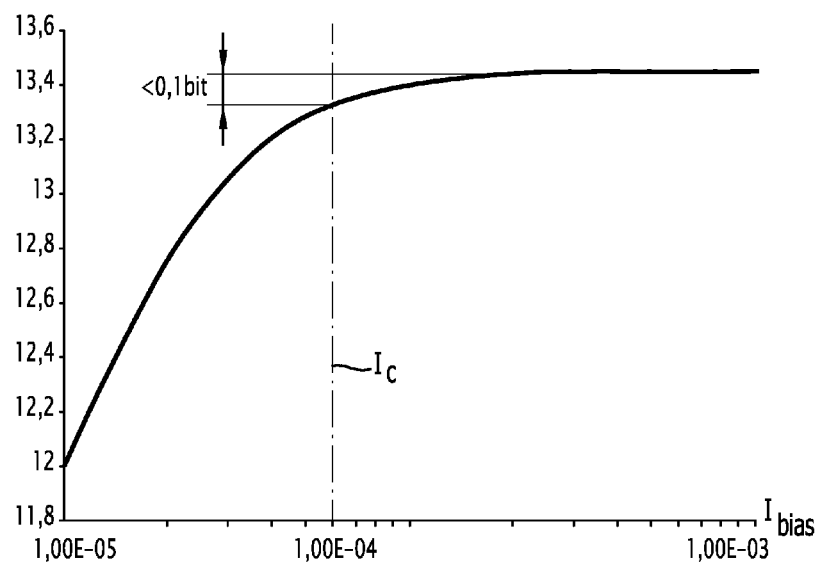
FIG. 4 is a graph representing the variation of the signal to noise ratio (SNR) as a function of the value of the biasing current.

Also shown in FIG. 4, is a graph representing the SNR as a function of the intensity of the biasing current $I_{bias}$.

It is found that, when the biasing current decreases, the signal to noise ratio in the initial period remains substantially constant up to a critical value of the biasing current, $I_c$, and then decreases, in the subsequent period, below this critical value.

This is due to the fact that, for the biasing currents that are higher than this critical value $I_c$, the background noise is dominated by the intrinsic 1/f noise which is in a constant ratio with the amplitude of the measurement signal as indicated here above.

On the other hand, for the biasing currents that are lower than this critical value $I_c$, the background noise is dominated by the thermal noise. The thermal noise being constant, when the biasing current decreases, the amplitude of the measurement signal decreases and the SNR can only decrease.

Based on the foregoing the following method of optimisation of the biasing current of the devices may be deduced.

Figure 5:
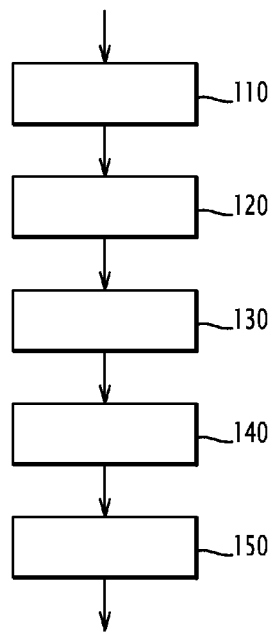
FIG. 5 is a block diagram of the process of optimisation of the power consumption of the device shown in FIG. 1.

This method is represented in FIG. 5. The first step 110 consists of defining the constraint from total consumption of the device, that is to say not only the consumption for the biasing of the gauges 12 and 14, but also the consumption by the acquisition means 18.

In order to take advantage of the mitigation of the intrinsic noise by the chopping of the biasing current, a biasing current that is higher than the critical value $I_c$ is required. Since it is sought to minimise the biasing current it is therefore necessary to be placed at the point of operation corresponding to this critical value $I_c$. It is shown that this critical value substantially corresponds to a biasing current such as the upper frequency fmax of the bandwidth of interest which is equal to the corner frequency fc.

Thus a determination is made at step 120, of the initial value of the biasing current, such that the corner frequency of the noise affecting the measurement signal corresponds to the maximum frequency of the bandwidth of interest. When using the device, the adjusting means 25 makes it possible to adjust the value of the biasing currents generated by the sources, at that predetermined value.

At step 130, the value of the duty cycle ratio of the chopping means is determined in a manner so as to reduce the power consumption. This is to minimise the duty cycle ratio in order to achieve the lowest possible power consumption, while also maintaining a certain margin over the lowest power consumption possible in a manner so as to take into account, depending on the electrical circuit chosen, the response time of the electronics ($T_{guard}$ in FIG. 2). During the use of the device, the adjusting means 27 makes it possible to adjust the value of the duty cycle of the chopping means, to this determined value.

Finally, in step 140, the power consumption of the gauges is determined based on the determined values of the biasing current and the duty cycle ratio. This consumption is subtracted from the total consumption defined in step 110 in order to obtain a power consumption value that may be assigned to the acquisition means.

This power consumption thus serves as a constraint for the development of the electronic chain of amplification, filtering and digitisation that make it possible to obtain the measurement signal (step 150).

During the use of the device, the optimal point of operation is, for example, the following:

$$I_{bias1}=I_{bias2}=1/2.10^{-4} A$$

$$R=2.5 k\Omega \text{ and } \Delta R/R=\pm 3.6 \cdot 10^{-2}$$

Where ΔR/R is the sensitivity of silicon nanowire.
range of frequencies $f_{min}$=0.1 Hz; $f_{max}$=1000 Hz
SNR=74 dB $$I \text{total}=2\times I_{bias}+I_{acq}=120\cdot 10^{-6} A$$

Where $I_{acq}$ is the intensity of the current in the acquisition means.

the total power of the device P=15 μW.

Numerous variants of the device are to be considered.

Figure 6:
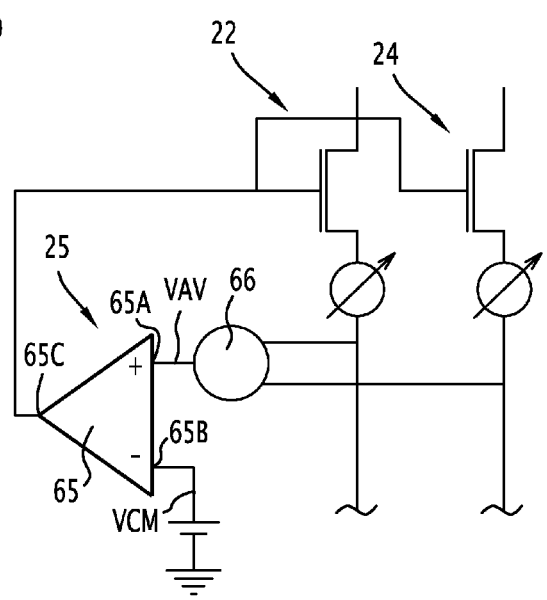
FIG. 6 is a partial graphical representation of a particular embodiment of the electrical circuit arrangement shown in FIG. 1.

In the embodiment illustrated in FIG. 6, illustrating only the current sources 22, 24 and an associated means of adjustment, the latter includes a differential amplifier 65 connected to the power sources 22, 24 in order to achieve a counter reaction in a manner so as to regulate the current supplied by the current sources 22, 24.

The differential amplifier 65 is for example an operational amplifier.

The differential amplifier 65 comprises an input 65A receiving a mean voltage VAV corresponding to the average of the voltages tapped at the input of the gauges 12, 14 (or the outputs of the current sources 22, 24), and an input 65B receiving a control voltage VCM. As shown in FIG. 6, the input 65A is non-inverting and the input 65B is inverting. By way of a variant, the input 65A is inverting and the input 65B is non-inverting.

The average voltage VAV is supplied by a mean module 66 comprising two inputs 66A, 66B each connected to the input of a respective gauge 12, 14 (or to the output of a respective current source 22, 24) and an output 66C connected to the input 65A input of the differential amplifier 65, the mean module 66 supplying at its output 66C a voltage that is the average of the voltages received at its inputs 66A, 66B.

The output 65C of the differential amplifier 65 is connected to each current source 22, 24 in a manner so as to regulate the intensity of the current $I_{bias1}$, $I_{bias2}$, delivered by each of the current sources 22, 24 respectively.

The current sources 22, 24 are for example transistors, in particular p-type metal oxide semiconductor (pMOS) transistors, the output 65C of the differential amplifier 25 is connected to the gate of each current source 22, 24.

The differential amplifier 65 dynamically controls the current supplied by the current sources 22, 24 depending on the difference between the average voltage VAV and the control voltage VCM. It thus compensates for the common mode drift, such as the temperature variation. In case of temperature change, the voltage at the input of each gauge 12, 14 (or at the output of each current source 22, 24) varies, but the difference in voltage is maintained constant.

The biasing current $I_{bias}$ is initially set by adjusting the VCM and/or VREF in a manner such that $I_{bias}$=(VCM−VREF)/$R_J$ where $R_J$ represents the ohmic resistance of the gauges 12, 14.

In the embodiment that has just been described in detail, the silicon nanowire is current biased. A similar description could be made using a device in which the silicon nanowire is voltage biased.

Quite obviously, the sensing part of the device presented here above includes two gauges, however the invention functions regardless of the number of silicon nanowires used.

The invention was described in conjunction with one or more special embodiments. It goes without saying, however, that changes and modifications can be undertaken without departing from the protective scope of the claims below.

The invention claimed is:

1. A resistive device, comprising:
   at least one silicon nanowire strain gauge (12, 14);
   a power supply means (16) comprising at least one current source (22, 24) able to generate a current ($L_{bias}$) for biasing the strain gauge, and
   an acquisition means (18) able to deliver a measurement signal usable to determine the variation in an electrical resistance of the strain gauge, wherein the power supply means comprises a chopping means (26), that is adapted to allow the biasing current generated by the or each current source to flow through the or each strain gauge only during a fraction of an operating cycle of the resistive device,
   wherein the resistive device comprises two silicon nanowire strain gauges incorporated in an electrical circuit of the differential type,
   wherein the power supply means comprises two current sources (22, 24), each capable of generating a current for biasing one of the gauges,
   wherein the power supply means further comprises a means for stabilization by switching (28), and wherein the acquisition means (18) comprises a demodulation means (60) positioned between the stage of amplification and the filtering means, the control signals (D0, D1) of the demodulation stage being correlated with the control signals (M0, M1) of the means for stabilization by switching and/or of the chopping means.

2. The resistive device according to claim 1, wherein the power supply means includes a means for adjusting the biasing current, capable of adjusting a value of the biasing current ($I_{bias}$) in a manner such that an upper frequency (fmax) of a bandwidth of interest for the measurement signal delivered by the resistive device is equal to a corner frequency (fc) of a background noise affecting the resistive device (10).

3. The resistive device according to claim 1, wherein the chopping means comprises a means for adjusting a duty cycle ratio, capable of adjusting said fraction of a operating cycle of the device to a value less than 75%.

4. The resistive device according to claim 1, wherein the lower frequency of the bandwidth of interest for the measurement signal delivered by the device substantially corresponds to a zero frequency (fmin).

5. The resistive device according to claim 1, wherein the acquisition means comprise a stage of amplification (58, 56), a means for filtering (62) and a means for digitising (64).

6. The resistive device according to claim 1, wherein the electrical circuit arrangement of the two gauges allows a common mode compensation.

7. The resistive device according to claim 1, wherein the resistive device comprises a differential amplifier (65) having two inputs and one output, one input receiving the average voltage of the inputs of the gauges (12, 14) or the outputs of the current sources (22, 24), the other input receiving a control voltage, and the output being connected to each current source (22, 24) in a manner so as to regulate the intensity of the current delivered by each of the current sources (22, 24).

8. The resistive device according to claim 1, wherein the resistive device comprises an inertial sensor.

9. A method for optimising the power consumption of a resistive device, comprising the steps of:
   defining an acceptable total consumption for the resistive device (10), wherein the resistive device comprises (a) at least one silicon nanowire strain gauge (12, 14), and (b) a power supply means (16) comprising (i) at least one current source (22, 24) able to generate a current ($I_{bias}$) for biasing the strain gauge, and (ii) an acquisition means (18) able to deliver a measurement signal usable to determine the variation in an electrical resistance of the strain gauge, wherein the power supply means comprises a chopping means (26), that is adapted to allow the biasing current generated by the or each current source to flow through the or each strain gauge only during a fraction of an operating cycle of the resistive device; wherein the resistive device comprises two silicon nanowire strain gauges incorporated in an electrical circuit of the differential type, wherein the power supply means comprises two current sources (22, 24), each capable of generating a current for biasing one of the gauges, wherein the power supply means further comprises a means for stabilization by switching (28), and wherein the acquisition means (18) comprises a demodulation means (60) positioned between the stage of amplification and the filtering means, the control signals (D0, D1) of the demodulation stage being correlated with the control signals (M0, M1) of the means for stabilization by switching and/or of the chopping means;
   calculating the value of a biasing current in a manner such that the upper frequency (fmax) of the bandwidth of interest for the measurement signal corresponds to a corner frequency (fc) of a background noise affecting the device;

adjusting the chopping means in a manner such that the power supply duty cycle ratio of the gauges leads to a predetermined signal to noise ratio for the device;

calculating the power consumption of the at least one strain gauge (12, 14) taking into account the calculated value of the biasing current and the value of the duty cycle determined;

evaluating a difference between the total acceptable consumption and the consumption of the said at least one strain gauge and assigning this difference as a constraint for the development of the electronic acquisition means (18).

10. The method of claim 9, further comprising calculating the value of the biasing current in a manner such that an upper frequency (fmax) of a bandwidth of interest for the measurement signal delivered by the resistive device corresponds to a corner frequency (fc) of a background noise affecting the resistive device, and a step of adjusting the said power supply means in a manner such that the biasing current in the strain gauge is equal to the calculated biasing current.

11. The method according to claim 10, further comprising adjusting the chopping means in a manner such that the power supply duty cycle ratio of the strain gauge corresponds to a predetermined signal to noise ratio.

12. The resistive device according to claim 1, wherein the chopping means comprises a means for adjusting a duty cycle ratio, capable of adjusting said fraction of a operating cycle of the device to a value less than 50%.

* * * * *